US010372531B2

(12) United States Patent
Prathapan et al.

(10) Patent No.: US 10,372,531 B2
(45) Date of Patent: Aug. 6, 2019

(54) ERROR-CORRECTING CODE MEMORY

(71) Applicant: TEXAS INSTRUMENTS INCORPORATED, Dallas, TX (US)

(72) Inventors: Indu Prathapan, Bangalore (IN); Prashanth Saraf, Bangalore (IN); Desmond Pravin Martin Fernandes, Bangalore (IN); Saket Jalan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 58 days.

(21) Appl. No.: 15/653,749

(22) Filed: Jul. 19, 2017

(65) Prior Publication Data
US 2018/0189133 A1    Jul. 5, 2018

(30) Foreign Application Priority Data

Jan. 5, 2017    (IN) .............................. 201741000483

(51) Int. Cl.
*G06F 11/10* (2006.01)
*G11C 5/04* (2006.01)
(Continued)

(52) U.S. Cl.
CPC ........ *G06F 11/1044* (2013.01); *G06F 3/0653* (2013.01); *G06F 11/108* (2013.01); *G06F 11/1012* (2013.01); *G06F 11/1068* (2013.01); *G06F 11/1076* (2013.01); *G11C 5/04* (2013.01); *G11C 7/1006* (2013.01); *G11C 7/22* (2013.01); *G11C 11/1675* (2013.01); *G11C 11/5628* (2013.01); *H03M 13/35* (2013.01); *G11C 2207/229* (2013.01); *G11C 2207/2263* (2013.01)

(58) Field of Classification Search
CPC .............. G06F 11/1044; G06F 3/0653; G06F 11/1012; G06F 11/1068; G06F 11/108; G06F 11/1076; G11C 5/04; G11C 7/1006; G11C 7/22; G11C 11/1675; G11C 11/5628; G11C 2207/2263; G11C 2207/229; H03M 13/35
USPC ....................... 714/768, 764, 766, 773, 799; 365/185.09, 201
See application file for complete search history.

(56) References Cited

U.S. PATENT DOCUMENTS 4,779,232 A * 10/1988 Fukunaka ............ G11C 7/1021
                                                    365/189.02
5,452,429 A *  9/1995 Fuoco ................. G06F 11/1056
                                                    711/105
(Continued)

OTHER PUBLICATIONS

International Search Report and Written Opinion, PCT/US2018/012477, dated May 10, 2018 (7 pages).

*Primary Examiner* — John J Tabone, Jr.
(74) *Attorney, Agent, or Firm* — Brian D. Graham; Charles A. Brill; Frank D. Cimino

(57) ABSTRACT

In the described examples, a memory controller includes a read-modify-write logic module that receives a partial write data request for partial write data in error-correcting code (ECC) memory and combines the partial write data in the partial write data request with read data provided from the ECC memory to form combined data prior to correcting the read data. The memory controller also includes a write control module that controls the writing of the combined data to the ECC memory.

20 Claims, 6 Drawing Sheets

(51) Int. Cl.
*G06F 3/06* (2006.01)
*G11C 11/16* (2006.01)
*G11C 11/56* (2006.01)
*H03M 13/35* (2006.01)
*G11C 7/10* (2006.01)
*G11C 7/22* (2006.01)

(56) References Cited

U.S. PATENT DOCUMENTS

| | | | | |
|---|---|---|---|---|
| 5,488,691 | A * | 1/1996 | Fuoco | G06F 11/1056 714/5.11 |
| 5,996,105 | A | 11/1999 | Zook | |
| 6,161,165 | A | 12/2000 | Solomon et al. | |
| 6,496,897 | B2 * | 12/2002 | Ware | G11C 7/22 365/189.04 |
| 6,785,835 | B2 * | 8/2004 | MacLaren | G11C 5/04 711/114 |
| 7,096,407 | B2 * | 8/2006 | Olarig | G06F 11/1044 714/768 |
| 7,275,200 | B2 * | 9/2007 | Leung | G06F 11/1056 714/763 |
| 7,743,311 | B2 | 6/2010 | Hassner et al. | |
| 7,958,427 | B1 | 6/2011 | Yeung et al. | |
| 8,145,985 | B2 * | 3/2012 | Moyer | G06F 11/1064 714/48 |
| 8,291,305 | B2 * | 10/2012 | Moyer | G06F 11/1064 714/799 |
| 9,136,871 | B2 | 9/2015 | Anholt et al. | |
| 9,189,329 | B1 | 11/2015 | Zhu et al. | |
| 9,268,632 | B2 | 2/2016 | Linstadt | |
| 9,436,548 | B2 | 9/2016 | Goodman et al. | |
| 2001/0039632 | A1 * | 11/2001 | MacLaren | G11C 5/04 714/6.2 |
| 2002/0002651 | A1 * | 1/2002 | MacLaren | G06F 13/4081 711/102 |
| 2002/0010875 | A1 * | 1/2002 | Johnson | G06F 11/108 714/5.1 |
| 2002/0042893 | A1 * | 4/2002 | Larson | G06F 11/1044 714/5.1 |
| 2003/0070055 | A1 * | 4/2003 | Johnson | G06F 13/1642 711/202 |
| 2003/0070113 | A1 * | 4/2003 | Ferguson | H04L 1/22 714/5.11 |
| 2003/0079073 | A1 * | 4/2003 | Richard | G06F 3/0601 710/302 |
| 2003/0088805 | A1 * | 5/2003 | Majni | G06F 11/108 714/5.1 |
| 2003/0101314 | A1 * | 5/2003 | Piccirillo | G06F 11/1658 711/106 |
| 2004/0163027 | A1 * | 8/2004 | MacLaren | G06F 11/108 714/764 |
| 2004/0163028 | A1 * | 8/2004 | Olarig | G06F 11/1044 714/767 |
| 2004/0172504 | A1 | 9/2004 | Balazich et al. | |
| 2006/0112321 | A1 * | 5/2006 | Leung | G06F 11/1056 714/774 |
| 2009/0276587 | A1 * | 11/2009 | Moyer | G06F 11/1044 711/155 |
| 2009/0276609 | A1 * | 11/2009 | Moyer | G06F 9/3004 712/220 |
| 2010/0064181 | A1 * | 3/2010 | Moyer | G06F 11/1064 714/48 |
| 2010/0064206 | A1 * | 3/2010 | Moyer | G06F 11/1064 714/800 |
| 2010/0251036 | A1 * | 9/2010 | Moyer | G06F 11/1064 714/53 |
| 2013/0007574 | A1 | 1/2013 | Langadi et al. | |
| 2015/0143201 | A1 | 5/2015 | Coteus et al. | |
| 2015/0278016 | A1 * | 10/2015 | La Fetra | H04L 1/0045 714/766 |
| 2015/0363263 | A1 | 12/2015 | Hassner et al. | |
| 2017/0063401 | A1 * | 3/2017 | Jeganathan | H03M 13/2909 |

* cited by examiner

ERROR-CORRECTING CODE MEMORY

RELATED APPLICATIONS

This application claims priority to India Provisional Application No. 201741000483 filed on 5 Jan. 2017, the entirety of which is incorporated herein by reference.

TECHNICAL FIELD

This disclosure relates generally to error-correcting code memory, and more particularly to a controller for error-correcting code memory.

BACKGROUND

A memory whose data is protected against transient errors using error correcting code (ECC) is called an ECC memory. Error-correcting code (ECC) memory is a type of computer data storage that can detect and correct the most common kinds of internal data corruption. ECC memory is used in computers where data corruption cannot be tolerated under nearly any circumstances, such as for, safety, scientific and/or financial computing. ECC memory has Error Correcting Code (ECC) bits along with data to facilitate detection and correction of errors. The extra error correcting code bits can be stored along with the data in the data memory or in a separate code memory of the ECC memory. A common error correcting code, a single-error correction and double-error detection (SECDED) Hamming code, allows a single-bit error to be corrected and double-bit errors to be detected.

In some examples, ECC memory maintains a memory system immune to single-bit errors. That is, the data that is read from each word in ECC memory is the same as the data that had been written to the ECC memory, even if one or more bits previously stored have been flipped to the wrong state. ECC schemes may be based on a data size that is larger than a smallest size of data that can be written, which is referred to a "partial data write". For such partial data writes, a read-modify-write operation is performed. To execute a read-modify-write operation, data is read data from the memory and checked for errors using the ECC checking logic. In case of a single bit error (SBE), the data is repaired using correction logic and corrected read data is then combined with the partial write data and written into the data memory. Combined data is also used to compute a new ECC code to be written into the code memory.

SUMMARY

In a first example, a memory controller includes a read-modify-write logic module that receives a partial write data request for partial write data in error-correcting code (ECC) memory and combines the partial write data in the partial write data request with read data provided from the ECC memory to form combined data prior to correcting the read data. The memory controller also includes a write control module that controls the writing of the combined data to the ECC memory.

In a second example, a memory controller includes an ECC check and repair module that receives read data and an error-correcting code from ECC memory and provides an ECC error signal indicating whether an error is detected in at least one bit location of the read data. The memory controller also includes a read-modify-write logic module that receives a partial write data request for partial write data in the ECC memory and combines the partial write data in the partial write data request with the read data provided from the ECC memory to form combined data prior to the ECC check and repair module detecting an error in the at least one bit location of the read data. The memory controller further includes a write control module that controls writing of the combined data to the ECC memory based on the ECC error signal.

In a third example a method includes receiving a partial write data request for data in ECC memory. The method also includes combining partial write data in the partial write data request with read data provided from the ECC memory to form combined data. The method further includes checking the accuracy of the read data in parallel with the combining.

DETAILED DESCRIPTION

Figure 1:
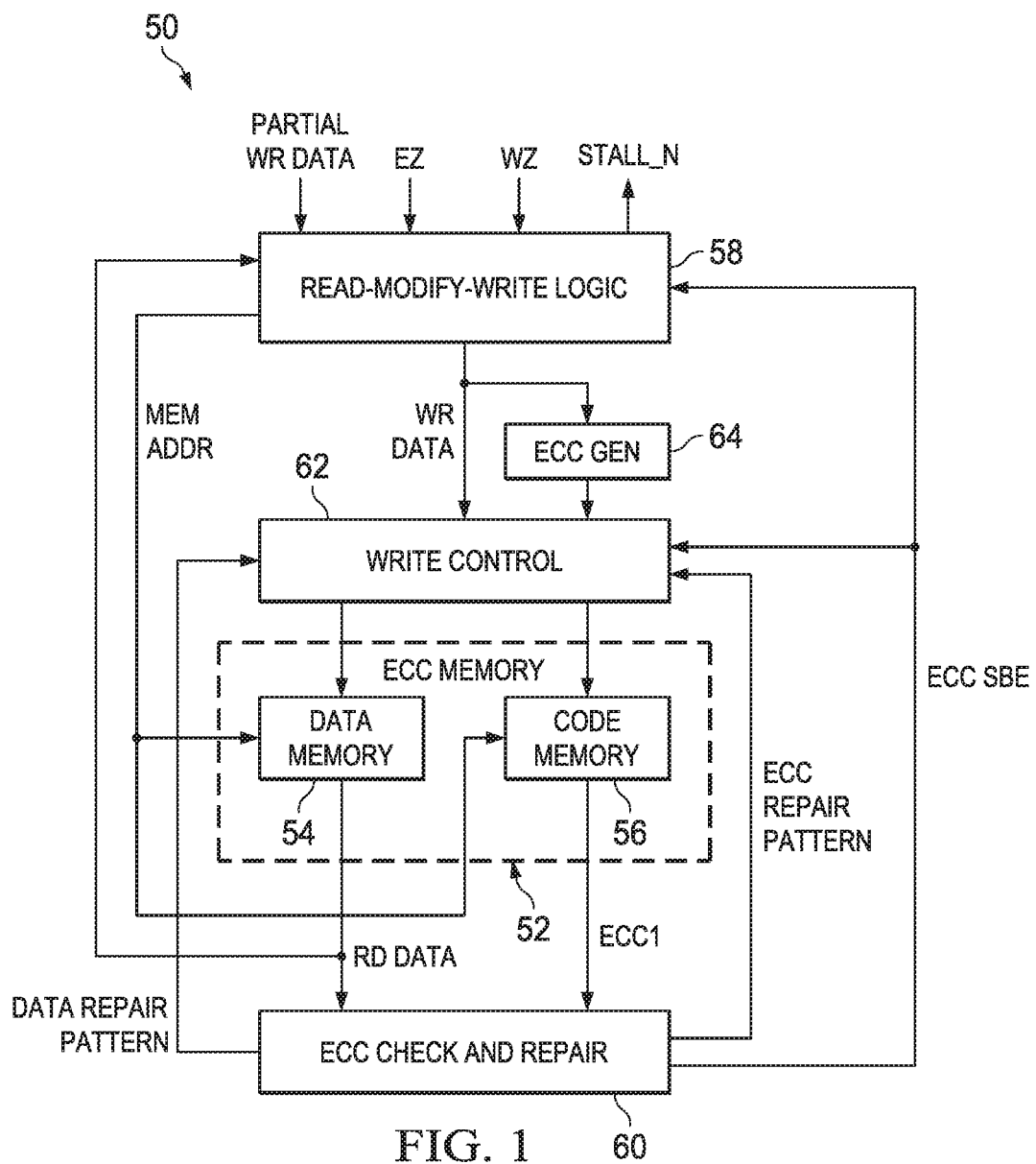
FIG. 1 is a block diagram of an example of a memory controller for executing partial memory writes.

Memory controllers and methods for implementing error-correcting code (ECC) protected memory during a partial memory write operation are described. The memory controllers are configured to operate in a manner that meets relatively tight timing requirements for ECC cores (main/master controllers) of large memories (data storage) including partial-width data writes.

In at least one example, the memory controller implements a read path and a write path that operate in parallel during a partial write. In particular, in a parallel operation, data that is read from an ECC memory ("read data") is combined with partial write data prior to correcting errors in the read data. The resultant combined data is employed to generate a new error-correcting code on the write path. For purposes of simplification of explanation, as used henceforth, the term "ECC" is employed to denote hardware (e.g., ECC memory), and the term, "error-correcting code" is employed to denote an actual instance of data that represents the error-correcting code, which may also be referred to as an error code word.

In parallel (e.g., both operating concurrently and operating on a parallel path), the error-correcting code is regenerated (re-computed) and a syndrome is generated for the read data by comparing the regenerated error-correcting code against the stored error-correcting code in code memory. The syndrome is used to decode the data bit error location in case of a single bit error detection. If an error is found to be in a bit location that is used to generate the combined data for computing a new error-correcting code for a partial write, the memory controller flips corrupted bits (through an XOR operation) and the resulting repaired data (which includes the partial write data) is written to memory. Similarly, bits in the error-correcting code that are impacted by corrupted data bits are flipped (through an XOR function)

using a relatively simple logic gate operation (e.g., one level of logic) to generate a repaired error-correcting code, which is written to the ECC memory. By generating the error-correcting code for the read and write paths in parallel, the timing of the controller is relaxed by avoiding the need for serial (back-to-back) calculations of error-correcting codes. In particular, by employing the parallel paths, as described herein, the partial write can be completed in two (2) clock cycles. In such a situation, during a first clock cycle, data is read from the data memory. During a second clock cycle, combined data is generated by combining data in the partial write with the read data, a new error-correcting code for the combined data is computed, and the combined data and the new error correcting code are written to the ECC memory (after the XOR function).

In another example, the memory controller implements pipelined-parallel processes on a read path and a write path to execute a partial memory write operation. In high frequency designs involving memories of big size (e.g., 1 Gigabyte or more), the memory delays may prohibit adding more logic levels on the read path. In such situations, the read data is registered (stored in a delay) before being used on the read path. The registering precedes error-correcting code computation and syndrome decoding on the read path. This registering results in latency increasing for a partial memory write (in the read-modify-write operation) by at least one clock cycle, such that the partial write operation completes in at least 3 clocks cycles instead of 2 clock cycles. However, the extra clock cycle can be avoided/mitigated by employment of pipelined-parallel operations, which is described as follows.

In the pipelined-parallel operations of a partial write, in a first clock cycle the data is read from ECC memory ("read data"). Moreover, a stall signal is asserted to the master controller to hold the write control signals for the ECC memory for one more clock cycle. In the second clock cycle, the read data is combined with the partial write data by the memory controller to form combined data, and an ECC generator generates a new error-correcting code. The combined data and the new error-correcting code are written into the ECC memory, and the stall signal is de-asserted. Additionally, in the second clock cycle, the read data is registered in a delay (flip flops).

The registered read data is available in the third clock cycle and is checked for data corruption. In case of a single bit error, the memory controller re-asserts the stall signal for one additional clock cycle to update the data in and the error-correcting code in the ECC memory with the correct values. Since the probability of a memory bit corruption is expected to be very low and infrequent (e.g., less than about 0.00001% of the time), the additional latency of one more clock cycle for error correcting is non-consequential.

FIG. 1 illustrates a block diagram of a portion of a memory controller 50 for executing a partial write to ECC memory 52 through a read-modify-write operation. The term "partial write" may alternatively be referred to as a partial data write or a partial data transfer. The ECC memory 52 is a non-transitory machine readable medium (e.g., random access memory) that may be employed in situations where highly accurate data (e.g., non-corrupted) is needed. That is, ECC memory 52 is often employed in safety applications, such as automotive brake control and/or airbag deployment wherein incorrect (corrupted data) could cause the improper function of the safety system. However, the ECC memory 52 may be deployed in nearly any computing environment where highly accurate data is needed or desired. The ECC memory 52 includes a data memory 54 and a code memory 56.

The data memory 54 includes memory cells for storing data, and the code memory 56 includes data cells for storing error-correcting codes for data stored in the data memory 54. Data words (referred to simply as "words") are formed of multiple cells in the data memory 54 and the code memory 56 are uniquely addressable. Data stored in data memory 54 of the ECC memory 52 has an assigned word size of K bits, where K is an integer equal greater than or equal to two (2).

In at least one example, the memory controller 50 includes read-modify-write logic 58 (a read-modify-write logic module) that executes a read-modify-write operation on the ECC memory 52 in response to a partial write data request (labeled in FIG. 1 as "PARTIAL WR DATA"). The partial write data request includes a unique address for a word in the data memory 54. Moreover, the partial write data request includes T number of bits to be written to the data memory 54, where T is an integer greater than or equal to one (1) and less than K, the word size of the data memory 54. That is, if the data memory 54 has a word size of 64 bits, T can be 1-63 bits to be written to the data memory 54 in the read-modify-write operation.

The read-modify-write logic 58 receives an active low memory enable signal ("EZ" in FIG. 1) and an active low write enable signal ("WZ" in FIG. 1) concurrently with the partial write data request. As used herein, an active low signal is asserted in situations where the active low signal is a logical '0' and de-asserted in situations where the active low signal is a logical '1'. If the memory enable EZ is de-asserted (e.g., a logical '1'), the memory cells included ECC memory 52 are inactive, and cannot be read and cannot be written to. Conversely, if EZ is asserted (e.g., a logical '0'), the memory cells included in the ECC memory are active and can be read from and/or written to. Moreover, WZ is de-asserted (e.g., logical '1') while EZ is asserted (e.g., logical '0'), the ECC memory 52 is executing a read operation. Additionally, if WZ is asserted (e.g., logical '0') while EZ is asserted (e.g., logical '0'), the ECC memory is executing a write operation.

In response to the write signal, WZ and the memory enable signal, EZ being asserted (e.g., logical '0'), the read-modify-write logic 68 asserts an active-low stall signal, STALL_N (logical '0'), which prevents subsequent memory operations on the ECC memory 52. Additionally, the read-modify-write logic 58 forwards an address signal, MEM ADDR (included in the partial write data request, PARTIAL WR DATA) to the ECC memory 52. In response, the data memory 54 provides a read data signal ("RD DATA" in FIG. 1.) to the read-modify-write logic 58. The read data signal, RD DATA includes the data stored at the memory location of the data memory 45 identified in the address of the signal (e.g., a data word).

In response to the read data signal, RD DATA, the read-modify-write logic 58 combines the data in RD DATA with data in the partial write data request, PARTIAL WR DATA to form combined data and generate a write data signal ("WR DATA" in FIG. 1). The write data signal, WR DATA contains the combined data that is to be written to the same location the data memory 54 (the location identified by the address signal, MEM ADDR). It is noted that the write data signal, WR DATA is generated prior to any error-correcting of the data in the read data signal, RD DATA. The write data signal, WR DATA is provided to a write control 62 (a write control module) and to an ECC generator 64.

In response to the write data signal, WR DATA, the ECC generator 64 generates a new error-correcting code for the combined data included in the write data signal, WR DATA and forwards the new error-correcting code to the write control 62. The write control 62 controls a timing of writing data to the data memory 54 and the code memory 56.

In a first example (hereinafter, "the first example"), which may be referred to as a parallel operation, and is explained in detail with respect to FIG. 2, the read data signal, RD DATA is also provided to an ECC check and repair 60 (an ECC check and repair module). Additionally, in response to the address signal, MEM ADDR, the code memory 56 of the ECC memory 52 provides an error-correcting code signal ("ECC1 in FIG. 1") to the ECC check and repair 60. The error-correcting code signal, ECC includes an error-correcting code stored at an address in the code memory 56 that corresponds to the address identified by the address signal, MEM ADDR, which address can be referred to as the error code address.

Continuing with the first example, in response to the read data signal, RD DATA, the ECC check and repair 60 employs the error-correcting code, ECC1 to identify errors in the data included in the read data signal, RD DATA. Moreover, the ECC check and repair 60 generates a data repair pattern signal ("DATA REPAIR PATTERN" in FIG. 1) that is provided to the write control 62. The data repair pattern signal, DATA REPAIR PATTERN includes data for correcting errors. Similarly, the ECC check and repair 60 generates an ECC repair pattern signal ("ECC REPAIR PATTERN") that is provided to the write control 62.

In the first example, the write control 62 employs the combined data in the write data signal, WR DATA and the data in the data repair pattern signal, DATA REPAIR PATTERN to generate a repaired data signal that includes data that is written to the data memory 54 at the address identified in the address signal, MEM ADDR. Additionally, the write control 62 employs the new error-correcting code from the ECC generator 64 and the ECC repair pattern signal, ECC REPAIR PATTERN from the error check and repair 60 to generate a repaired error-correcting code for the data that is written to the code memory 56 at the error code address. Further, following the repaired error-correcting code being written, the read-modify-write logic 58 de-asserts the stall signal, STALL_N (e.g., logical '1') to enable subsequent memory operations on the ECC memory 52.

In a second example (hereinafter, "the second example"), which may be referred to as a pipelined-parallel operation and is explained in detail with respect to FIG. 4, in response to the write data signal, WR DATA and the new error-correcting code, the write control 62 writes the combined data to the data memory 54 at the address identified in the address signal, MEM ADDR and the new error-correcting code to the error code address of the code memory 56. Further, the read-modify-write logic 58 de-asserts the stall signal, STALL_N (e.g., logical '1').

Subsequently, the read-data signal, RD DATA (registered in delays) and the error-correcting code, ECC1 are analyzed for errors, and if the ECC check and repair 60 determines that a single bit error is present in the data included in the read data signal, RD DATA, the ECC check and repair 60 asserts (e.g., logical '1') an ECC single bit error signal ("ECC SBE" in FIG. 1) and provides the ECC single bit error signal, ECC SBE to the write control 62 and to the read-modify-write logic 58. The ECC single bit error signal, ECC SBE may alternatively be referred to as an ECC error signal. Conversely, if the ECC check and repair 60 determines that no error is present in the read data signal, RD DATA, the ECC single bit error signal, ECC SBE is de-asserted (e.g., logical '0') and provided to the write control 62 and to the read-modify-write logic 58.

In the second example, in response to the single bit error signal, ECC SBE being asserted (e.g., logical '1'), the read-modify-write logic 58 asserts the stall signal, STALL_N (e.g., logical '0') that prevents subsequent data transfers for other operations on the ECC memory 52. Additionally, assertion of the single bit error signal, ECC SBE causes the write control 62 to employ the data repair pattern signal, DATA REPAIR PATTERN and the ECC repair pattern signal, ECC REPAIR PATTERN to correct the data that was written to the address of the data memory 54 identified in the address signal, MEM ADDR and to the error-correcting code that was written to the error address of the code memory 56. Moreover, the read-modify-write logic 58 de-asserts the stall signal, STALL_N and allows subsequent operations on the ECC memory 52.

Conversely, in the second example, in response to the single bit error signal, ECC SBE being de-asserted (e.g., logical '0'), the read-modify-write logic 58 continues to de-assert the stall signal, STALL_N (e.g., logical '0'). In this manner, the combine data and the new error-correcting code written to the ECC memory 52 are unchanged.

In both the first and second examples, the data (included in RD DATA) is read from the data memory 54 and combined with the data in the partial write data request, PARTIAL WR DATA prior to error correction of the data in the read data signal, RD DATA. Thus, the error correction is executed in parallel with other operations to reduce latency of the read-modify-write operation.

Figure 2:
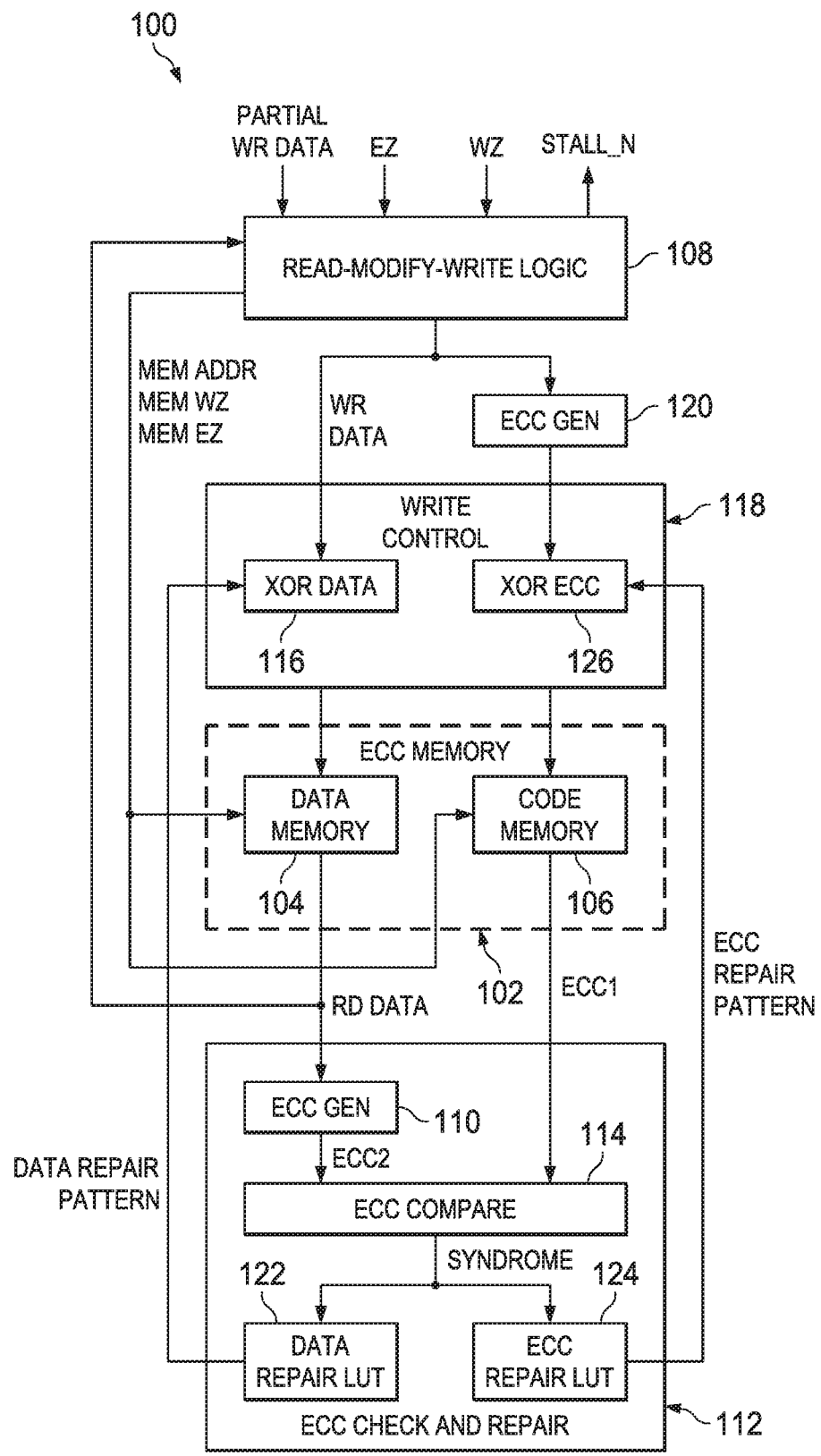
FIG. 2 is a block diagram of another example of a memory controller for executing partial memory writes.

FIG. 2 illustrates another example of a block diagram of a portion of a memory controller 100 for executing a partial write to ECC memory 102 with a read-modify-write operation. The memory controller 100 executes processes in a parallel operation. In at least one example, the memory controller 100 may be employed to implement the memory controller 50 illustrated in FIG. 1. The ECC memory 102 is a non-transitory machine readable medium (e.g., random access memory) that may be employed in situations where highly accurate data (e.g., non-corrupted) is needed, such as safety applications (e.g., automotive), financial applications or the like. The ECC memory 102 includes a data memory 104 and a code memory 106.

The data memory 104 includes memory cells for storing data, and the code memory 106 includes data cells for storing error-correcting codes for data stored in the data memory 104. Words are formed of multiple cells in the data memory 104 and the code memory 106 are uniquely addressable. Data stored in data memory 104 of the ECC memory 102 has an assigned word size of K bits.

In at least one example, the memory controller 100 includes read-modify-write logic 108 that executes a read-modify-write operation on the ECC memory 102 in response to a partial write data request (labeled in FIG. 2 as "PARTIAL WR DATA"). The partial write data request, PARTIAL WR DATA includes a unique address for a word in the data memory 104. Moreover, the partial write data request, PARTIAL WR DATA includes T number of bits to be written to the data memory 104, where T is an integer greater than or equal to one (1) and less than K, the word size of the data memory 104. That is, if the data memory 104 has a word size of 32 bits, T can be 1-31 bits to be written to the data memory 104 in the read-modify-write operation.

The read-modify-write logic 108 receives an active low memory enable signal ("EZ" in FIG. 2) and an active low write enable signal ("WZ" in FIG. 2) concurrently with the partial write data request, PARTIAL WR DATA. In response to the write enable signal, WZ and the memory enable signal, EZ being de-asserted (e.g., logical '0'), in a first clock cycle (from a master memory controller, not shown), the read-modify-write logic 108 asserts a stall signal, STALL_N, which prevents subsequent memory operations on the ECC memory 102. Additionally, the read-modify-write logic 108 forwards an address signal, MEM ADDR (included as ADDR in the partial write data signal, PARTIAL WR DATA to the data memory) to the ECC memory 102. The read-modify-write logic 108 also provides an active-low asserted conditioned memory enable signal, MEM EZ (e.g., logical '0') and an active-low de-asserted conditioned memory rewrite signal, MEM WZ (e.g., logical '1') that correspond to the memory enable signal, MZ and the write enable signal, WZ. In response, the data memory 104 provides a read data signal ("RD DATA" in FIG. 1.) to the read-modify-write logic 108 and to an ECC generator 110 of an ECC check and repair 112. The read data signal, RD DATA includes the data stored at the memory address identified in the address signal, MEM ADDR (e.g., a data word). In further response to the address signal, MEM ADDR, the code memory 106 of the ECC memory 102 provides an error-correcting code signal ("ECC1 in FIG. 2") to an ECC compare 114 of the ECC check and repair 112. The error-correcting code signal, ECC includes an error code stored at an address in the code memory 106 that corresponds to the address identified by the address signal, MEM ADDR, which address can be referred to as the error code address.

In the second clock cycle (from the main memory controller), in response to the read data signal, RD DATA, the read-modify-write logic 108 modifies the data in RD DATA by combining the data in RD DATA with data in the partial write data request, PARTIAL WR DATA to generate a write data signal ("WR DATA" in FIG. 2). Additionally, the read-modify-write logic 108 asserts the MEM_WZ signal (e.g., logical '0'). The write data signal, WR DATA contains combined data that is to be written to the same location the data memory 104 (the location identified by the address signal, MEM ADDR). The write data signal, WR DATA is generated prior to employment of any error-correcting codes to correct errors of data that may be previously stored in the data memory 104. The write data signal, WR DATA is provided to XOR data logic 116 of a write control 118 and to an ECC generator 120. Further, the read-modify-write logic 108 de-asserts the stall signal, STALL_N.

Additionally, in the second clock cycle, in response to the write data signal, WR DATA, the ECC generator 120 generates an error-correcting code that is provided to the XOR ECC logic 119 (XOR gate logic). Additionally, during the second clock cycle, in a parallel operation, in response to the read data signal, RD DATA, the ECC generator 110 of the ECC check and repair 112 generates a re-computed error-correcting code ("ECC2" in FIG. 2) for data included in the read data signal, RD DATA. The re-computed error-correcting code, ECC2 is provided to the ECC compare 114. The ECC compare 114 compares the error-correcting code, ECC1 provided from the code memory 106 with the re-computed error-correcting code, ECC2 and generates a syndrome signal ("SYNDROME" in FIG. 2) that identifies errors in the data included in the read data signal, RD DATA. In particular, the syndrome signal, SYNDROME identifies bits in the read data signal, RD DATA that are corrupted. In at least one example, if no bits in the data included in the read data signal, RD DATA and/or the error-correcting code, ECC1 have changed since the error-correcting code, ECC1 was generated (at the time of storage at the data memory 104), the syndrome signal, SYNDROME has a value of logical '0'. In that example, if one or more bits in the data included in the read data signal, RD DATA have changed since the error-correcting code, ECC1 was generated, the syndrome signal, SYNDROME is set to a value that identifies particular bits that have been corrupted in the data from the read data signal, RD DATA.

The syndrome signal, SYNDROME is provided to a data repair lookup-table (LUT) 122 and to an ECC repair LUT 124. The data repair LUT 122 converts the syndrome signal into a data repair pattern signal ("DATA REPAIR PATTERN" in FIG. 2) that is provided to the XOR data logic 116 of the write control 118. The data repair pattern signal, DATA REPAIR PATTERN, contains data that is employable to restore/correct the data in the read data signal, RD DATA to the same value that the data in the data read signal, RD DATA to the correct value. Similarly, the ECC repair LUT 124 converts the syndrome signal, SYNDROME into an ECC repair pattern signal ("ECC REPAIR PATTERN" in FIG. 2) that is employable to restore/correct the error-correcting code, ECC1.

The XOR data logic 116 executes an XOR function on the data repair pattern signal, DATA REPAIR PATTERN and the write data signal, WR DATA to generate a repaired data value that is written in the memory address of the data memory 104 identified in the address signal, MEM ADDR. In particular, the XOR data logic 116 flips ("XOR's") corrupted data bits (identified by the syndrome signal, SYNDROME) prior to writing the corrected data to the data memory 104. The XOR ECC logic 119 executes an XOR function on the ECC repair pattern signal, ECC REPAIR PATTERN and the new error-correcting code to generate the repaired data value that is written to the code memory 106 at the error code address. In particular, the XOR ECC logic 126 flips error-correcting code bits that are impacted by the corrupted data to generate the repaired error-correcting code that is written to the code memory 106. Additionally, the read-modify write logic de-asserts the conditioned memory enable signal, MEM EZ and the conditioned memory write signal MEM WZ signal (e.g., logical '1').

Figure 3:
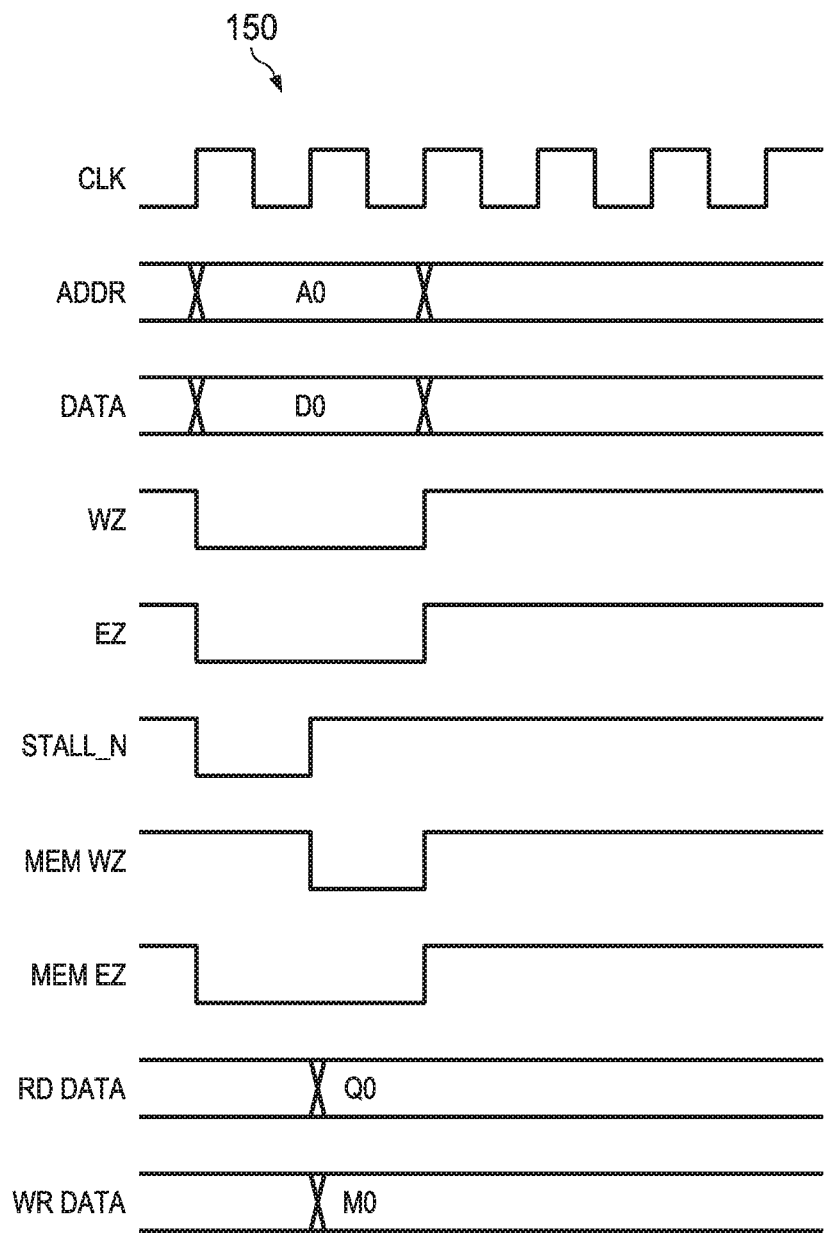
FIG. 3 is a timing diagram of example waveforms employable by the memory controller of FIG. 2.

FIG. 3 illustrates a timing diagram 150 of example waveforms employed by the memory controller 100. In the timing diagram 150, the clock signal, CLK, the address signal, ADDR and the data signal, DATA are included in the partial write data signal, PARTIAL WR DATA of FIG. 2 or are provided as separate signals (not shown). The timing diagram 150 illustrates a partial write of D0 to memory address A0.

As illustrated in the timing diagram 150, memory, Q0 is read from the data memory 104 and combined with D0 to form memory M0. The memory M0 is written to the data memory 104 in the address A0.

Referring back to FIG. 3, by employing the portion of the memory controller 100, the data read from the data memory 104 (RD DATA) is directly used to combine with the data in the partial write data request, PARTIAL WR DATA. Accordingly, the error-correcting code generation executed by the ECC generator 120 (in the write path) operates in parallel with the error-correcting code re-generation executed by the ECC generator 110 of the ECC check and repair 112. Therefore, a timing path for a read-modify-write operation avoids the need to serially (e.g., back-to-back) generate error-correcting codes.

As an example, the critical path for the read-modify-write operation executed by the memory controller 100 is defined by Equation 1.

$$CP = DR + ECC_{Check} + \text{Syndrome Decode} + XOR \quad \text{Equation 1:}$$

Wherein:

CP is the critical path time/delay, in picoseconds (ps);

DR is the clk2q (clock-to-Q) delay of the data memory 104; $ECC_{Check}$ is the delay from the error-correcting code generation by the ECC generators 120 and 120 as well as the compare time for the ECC compare 114;

Syndrome Decode is the delay for the generation of the data repair pattern signal, DATA REPAIR PATTERN, by the data repair LUT and the generation of the ECC repair pattern signal, ECC REPAIR PATTERN, by the ECC repair LUT 124;

XOR is the delay time for executing the XOR logic on the data repair pattern signal, DATA REPAIR PATTERN, by the XOR data logic 116 and the delay time for executing the XOR logic on ECC repair pattern signal, ECC REPAIR PATTERN, by the XOR ECC logic 126.

In some examples, the critical path, CP has a delay of about 20% (or greater) less than the critical path of a system that employs serially generated error-correcting codes. Accordingly, the memory controller 100 is employable in systems that have a high frequency clock signal, without the need for additional control logic.

Figure 4:
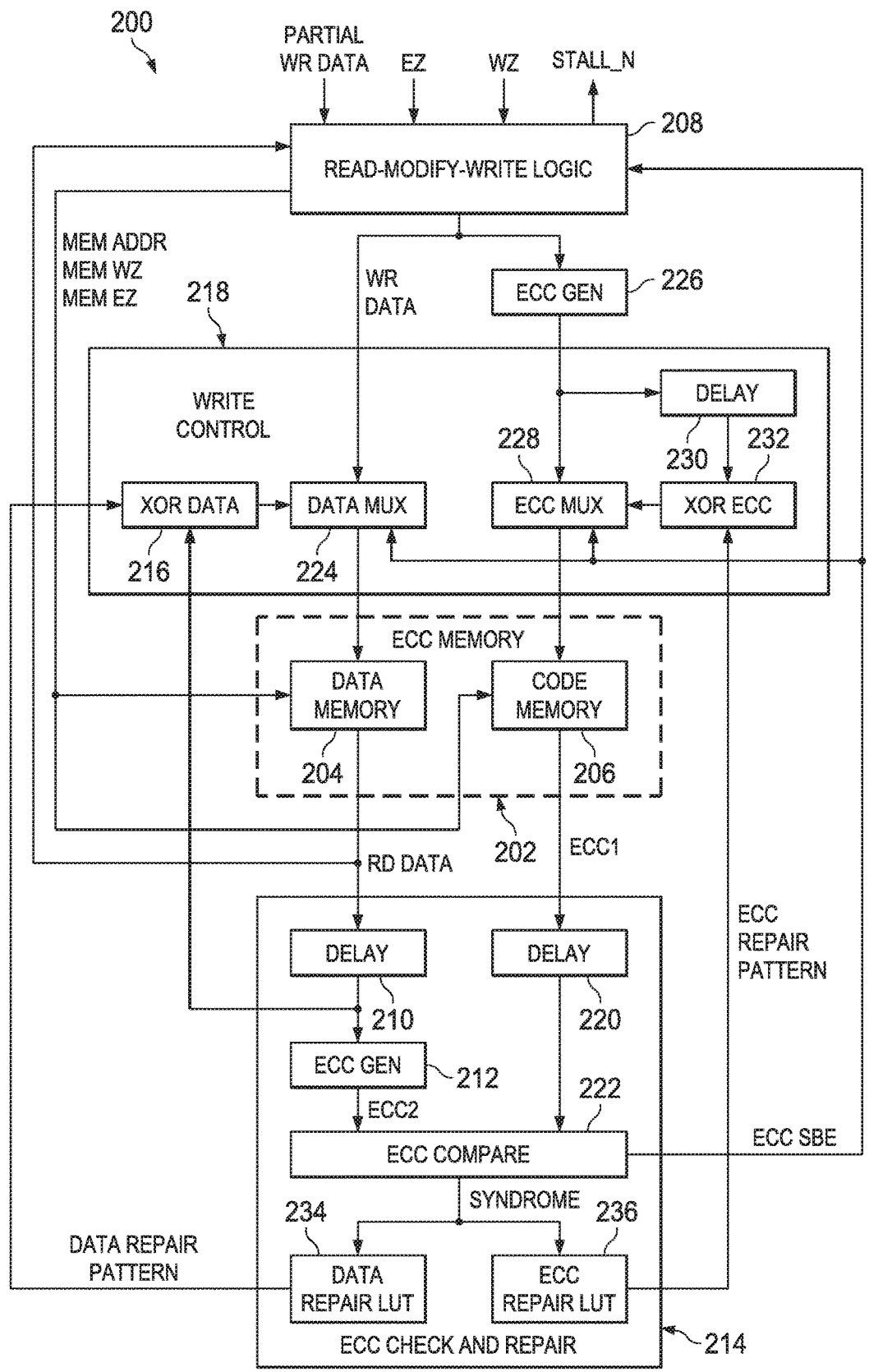
FIG. 4 is a block diagram of yet another example of a memory controller for executing partial memory writes.

FIG. 4 illustrates another example of a block diagram of a portion of a memory controller 200 for executing a partial write to ECC memory 202 with a read-modify-write operation. In at least one example, the memory controller 200 is employed to implement a pipelined-parallel operation. In at least one example, the memory controller 200 may be employed to implement the memory controller 50 illustrated in FIG. 1. The ECC memory 202 is a non-transitory machine readable medium (e.g., random access memory) that may be employed in situations where highly accurate data (e.g., non-corrupted) is needed, such as safety applications (e.g., automotive), financial applications or the like. The ECC memory 202 includes a data memory 204 and a code memory 206.

The data memory 204 includes memory cells for storing data, and the code memory 206 includes data cells for storing error-correcting codes for data stored in the data memory 204. Words are formed of multiple cells in the data memory 204 and the code memory 206 are uniquely addressable. Data stored in data memory 204 of the ECC memory 202 has an assigned word size of K bits.

In at least one example, the memory controller 200 includes read-modify-write logic 208 that executes a read-modify-write operation on the ECC memory 202 in response to a partial write data request (labeled in FIG. 2 as "PARTIAL WR DATA"). The partial write data request, PARTIAL WR DATA includes a unique address for a word in the data memory 204. Moreover, the partial write data request, PARTIAL WR DATA includes T number of bits to be written to the data memory 204, where T is an integer greater than or equal to one (1) and less than K, the word size of the data memory 204. That is, if the data memory 204 has a word size of 32 bits, T can be 1-31 bits to be written to the data memory 204 in the read-modify-write operation.

The read-modify-write logic 208 receives an active low memory enable signal ("EZ" in FIG. 4) and an active low write enable signal ("WZ" in FIG. 4) concurrently with the partial write data request, PARTIAL WR DATA. In response to the write enable signal WZ and memory enable signal EZ being asserted (e.g., logical '1'), in a first clock cycle (from a main/master memory controller, not shown), the read-modify-write logic 208 asserts an active-low stall signal, STALL_N (e.g., logical '0'), which prevents subsequent memory operations on the ECC memory 202. Additionally, the read-modify-write logic 208 forwards an address signal, MEM ADDR (included as ADDR in the partial write data signal, PARTIAL WR DATA) to the ECC memory 202. The read-modify-write logic 208 also forwards an asserted active-low conditioned memory enable signal, MEM EZ (e.g., logical '0') and a de-asserted conditioned memory write signal, MEM WZ (e.g., logical '1'). In response, the data memory 204 provides a read data signal ("RD DATA" in FIG. 1.) to the read-modify-write logic 208 and to a delay 210 (e.g., flip-flops), thereby registering/pipelining the data in the read data signal, RD DATA. The read data signal, RD DATA includes the data stored at the memory location identified in the address signal (e.g., a data word). After a predetermined delay (e.g., about one (1) clock cycle), the delay 210 passes the read data signal, RD DATA to an ECC generator 212 of an ECC check and repair 214. The delay 210 also passes the read data signal, RD DATA to XOR data logic 216 (e.g., XOR gates) of a write control 218.

In further response to the address signal, MEM ADDR, the code memory 206 of the ECC memory 202 provides an error-correcting code signal ("ECC in FIG. 4") to a delay 220, thereby registering the error-correcting code signal, ECC. The error-correcting code signal, ECC includes an error code stored at an address in the code memory 206 that corresponds to the address identified by the address signal, MEM ADDR, which address can be referred to as the error code address. After a predetermined delay, such as about one clock cycle, the delay 220 passes the error-correcting code signal, ECC to an ECC compare 222 of the ECC check and repair 214. It is noted that the delay 210 and the delay 220 are illustrated as being a functional block of the ECC check and repair 214, but in other examples, the delay 210 and/or the delay 220 could be implemented external to the ECC check and repair 214.

In the second clock cycle (from the main memory controller), in response to the read data signal, RD DATA, the read-modify-write logic 208 modifies the data in RD DATA by combining the data in RD DATA with data in the partial write data request, PARTIAL WR DATA to generate combined data. The read-modify-write logic 208 generates a write data signal ("WR DATA" in FIG. 4) and asserts the conditioned memory write signal, MEM EZ (e.g., logical '0'). The write data signal, WR DATA contains the combined data that is to be written to the same location in the data memory 204 (the location identified by the address signal, MEM ADDR). The write data signal, WR DATA is generated prior to employment of any error-correcting codes to correct errors of data that may be previously stored in the data memory 204. The write data signal, WR DATA is provided to an input node of a data multiplexer (MUX) 224 of the write control 218 and to an ECC generator 226.

The ECC generator 226 generates a new error-correcting code for the combined data in the write data signal, WR DATA and passes the new error-correcting code to an input of an ECC MUX 228 and to a delay 230. After a predetermined amount of time (e.g., one clock cycle), the delay 230 passes the new error-correcting code to XOR logic 232 of the write control 218. Further, the read-modify-write logic 208 de-asserts (e.g., logical '1') the stall signal, STALL_N. Additionally, in some examples, the read-modify-write logic 208 also de-asserts (e.g., logical '1') the conditioned memory write signal, MEM WZ.

The XOR data logic 216 provides a signal to another input of the data MUX 224. Additionally, the XOR ECC logic 232 provides a signal to another input of the ECC MUX 228. Moreover, the ECC compare 222 provides an ECC single bit error ("ECC SBE" in FIG. 4) to a control/selection node of the data MUX 224 and the ECC MUX 228. During the second clock cycle, the ECC single bit error signal, ECC SBE is de-asserted (e.g., logical '0') causing the data MUX 224 and the ECC MUX 228 to select the input node assigned to the write data signal, WR DATA. In response to the single bit error signal, ECC SBE, the data mux 224 writes the combined data in the write data signal, WR DATA to the address in the data memory 204 identified in the address signal, MEM ADDR. Additionally, the ECC MUX 228 writes the new error-correcting code to the corresponding error address in the code memory 206. In this manner, the combined data is registered with the ECC memory 202.

Further, in a third clock cycle, after writing the combined data to the data memory 204 and the new error-correcting code to the code memory 205, the registered/pipelined read data, RD DATA is output from the delay 210 to the ECC generator 212. Similarly, the error-correcting code, ECC1 at the delay 220 outputs the registered/pipelined error-correcting code, ECC1 to the ECC compare 222. The ECC generator 212 of the ECC check and repair 214 generates a re-computed error-correcting code ("ECC2" in FIG. 4) for data included in the read data signal, RD DATA. The re-computed error-correcting code, ECC2 is provided to the ECC compare 222. The ECC compare 222 compares the error-correcting code, ECC1 provided from the delay 220 with the re-computed error-correcting code, ECC2 and generates a syndrome signal ("SYNDROME" in FIG. 4) that identifies errors in the data included in the read data signal, RD DATA. In at least one example, if no bits in the data included in the read data signal, RD DATA and/or the error-correcting code, ECC1 have changed since the error-correcting code, ECC1 was generated (at the time of storage at the data memory 204), the syndrome signal, SYNDROME has a value of logical '0'. In that example, if one or more bits in the data included in the read data signal, RD DATA have changed (e.g., through corruption) since the error-correcting code, ECC1 was generated, the syndrome signal, SYNDROME is set to a value that identifies particular bits that have been corrupted in the data from the read data signal, RD DATA and/or the error-correcting code, ECC1.

The ECC compare 222 sets the ECC single bit error signal, ECC SBE based on the value of the syndrome signal. For instance, if the syndrome signal, SYNDROME has a value indicating that there are no errors in the data in the read data signal, RD DATA and/or the error-correcting code, ECC1, the ECC compare 222 maintains the single bit error signal, ECC SBE at the initial state (e.g., logical '0'). Conversely, if the syndrome signal, SYNDROME has a value indicating that there are no errors in the data in the read data signal, RD DATA and/or the error-correcting code, ECC1, the ECC compare 222 sets the single bit error signal, ECC SBE to an error state (e.g., logical '1'). As noted, the ECC single bit error signal, ECC SBE is provided to the read-modify-write logic 208, the data MUX 224 and the ECC MUX 228.

The syndrome signal, SYNDROME is provided to a data repair LUT 234 and to an ECC repair LUT 236. The data repair LUT 234 converts the syndrome signal into a data repair pattern signal ("DATA REPAIR PATTERN" in FIG. 2) that is provided to the XOR data logic 216 of the write control 218. The data repair pattern signal, DATA REPAIR PATTERN, contains data that is employable to correct corrupted data in the read data signal, RD DATA. Similarly, the ECC repair LUT 236 converts the syndrome signal, SYNDROME into an ECC repair pattern signal ("ECC REPAIR PATTERN" in FIG. 4) that is employable to restores the error-correcting code, ECC1.

The XOR data logic 216 executes an XOR function on the data repair pattern signal, DATA REPAIR PATTERN, and the data from the read data signal, RD DATA, provided from the delay 210 to generate a repaired data value that is input to the other input of the data MUX 224. In particular, the XOR data logic 216 flips ("XOR's") corrupted data bits (identified by the syndrome signal, SYNDROME), which are provided to the other input of the data MUX 224. The XOR ECC logic 232 executes an XOR function on the ECC repair pattern signal, ECC REPAIR PATTERN, and the new error-correcting code provided from the delay 230 to generate a repaired error-correcting code that is provided to the other input of the ECC MUX 228. In particular, the XOR ECC logic 232 flips error-correcting code bits that are impacted by the corrupted data to generate the repaired error-correcting code that is provided to the other input of the ECC MUX 228.

During the third clock cycle, in response to receipt of the single bit error signal, ECC SBE in the error state (e.g., logical '1'), the read-modify-write logic 208 asserts the stall signal, STALL_N and the conditioned write signal, MEM WZ (e.g., logical '0'). Additionally, in response to receipt of the single bit error signal, ECC SBE in the error state (e.g., logical '1'), the data MUX 224 selects the other input from the XOR data logic 216 and the ECC MUX 228 selects the other input from the XOR ECC logic 232. Moreover, the value provided to the data MUX 224 from the XOR data logic 216 (repaired data) is written to the data memory 204 at the address identified in the address signal, MEM ADDR. Similarly, the value provided to the ECC MUX 228 from the XOR ECC logic 232 (repaired error-correcting code) is written to the corresponding error address in the code memory 206. The read-modify-write logic 208 de-asserts the stall signal, STALL_N (e.g., logical '1'). Additionally, in some examples, the read-modify-write logic 208 de-asserts (e.g., logical '1') the conditioned memory enable signal, MEM EZ and the conditioned write signal, WZ.

Figure 5:
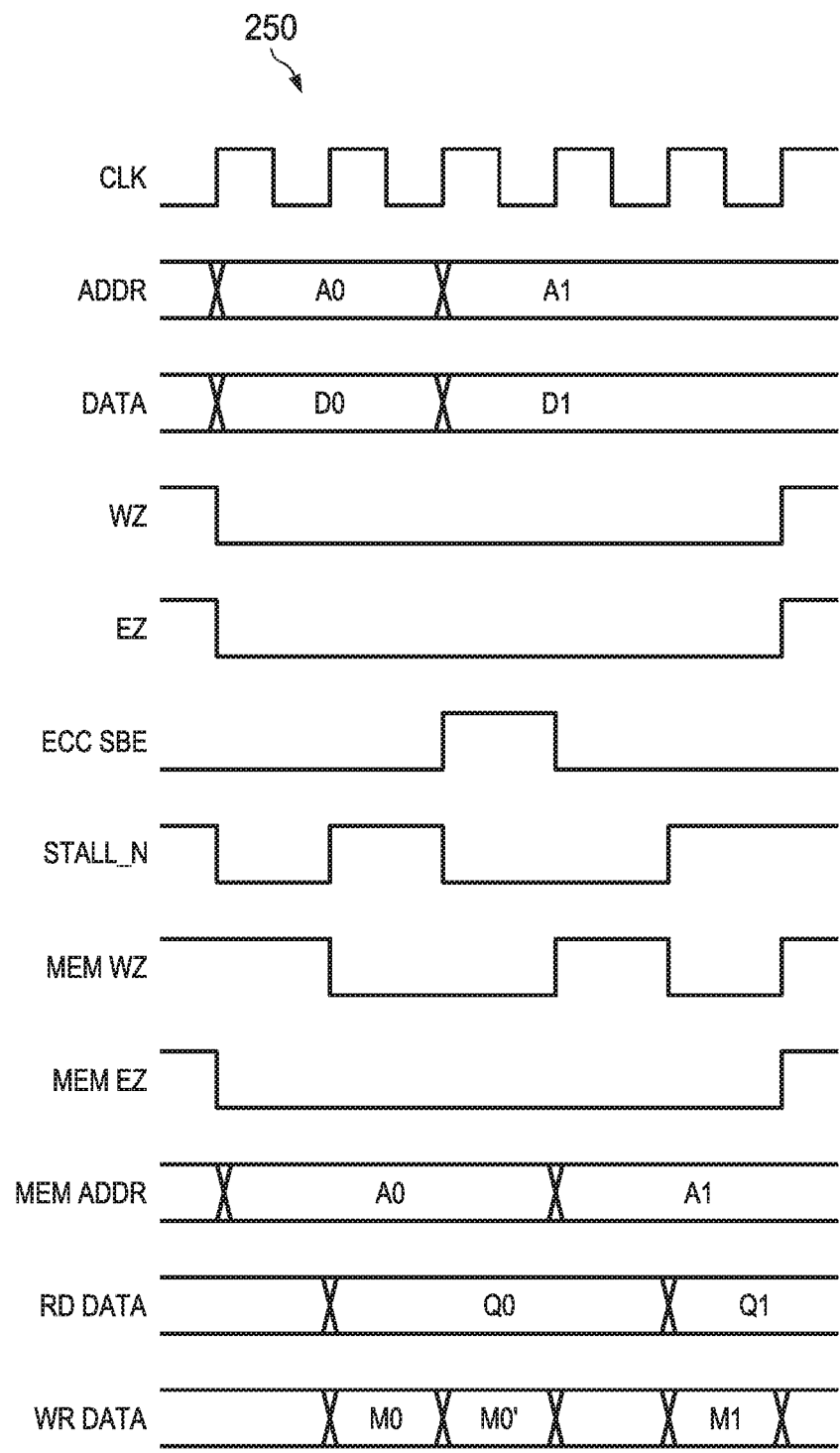
FIG. 5 is a timing diagram of example waveforms employable by the memory controller of FIG. 2.

FIG. 5 illustrates a timing diagram 250 of example waveforms employed by the memory controller 200. In the timing diagram 250, the clock signal, CLK, the address signal, MEM ADDR and the data signal, DATA are included in the partial write data signal, WR DATA of FIG. 4 or may be provided separately (not shown). The timing diagram 250 illustrates a partial write of D0 to memory address A0, and a partial write of D1 to memory address A1.

In the timing diagram 150, the read data signal, RD DATA provides data, Q0, that is combined with data in the data signal, D0 to form combined data, M0 that is written to the data memory 204. However, it is presumed that there is an error in the data, Q0, which is indicated by a rising edge (indicating the error state) on the ECC single bit error signal, ECC SBE. Thus, the stall signal, STALL_N is asserted, and the data is corrected to form data M0' that is re-written to the data memory 204, which causes the ECC signal bit error signal, ECC SBE to return to the initial state. This allows the second partial write of D1 to memory address A1 to commence. The second partial write combines data Q1 with the data D1 to form combined data M1 that is written to the memory address A1.

Referring back to FIG. 4, by employing the portion of the memory controller 200, the data read from the data memory 204 (RD DATA) is directly used to combine with the data in the partial write data request, PARTIAL WR DATA. Moreover, when an error occurs, a third clock cycle is employed to correct the error. However, in many applications, errors are extremely rare, often occurring at less than 0.00001% of the time. Thus, by writing data to the ECC memory 202 prior to completion of an error check and repair is completed, significant time savings can be achieved. That is, the memory controller 200 provides time savings by operating under the assumption that the great majority of the time (e.g., about 0.99999% or more), no correction of data and/or an error-correcting code is needed.

Figure 6:
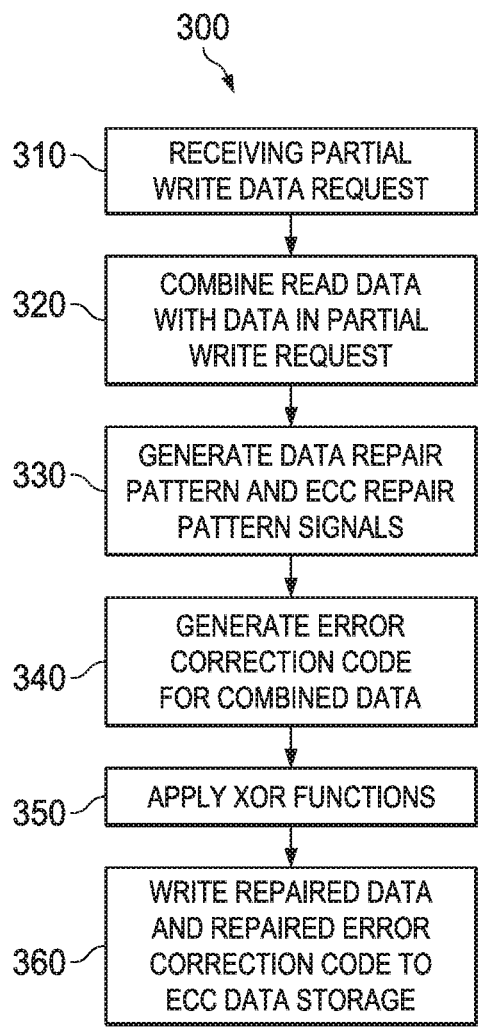
FIG. 6 is a flow diagram of an example method for executing a partial memory write.
Figure 7:
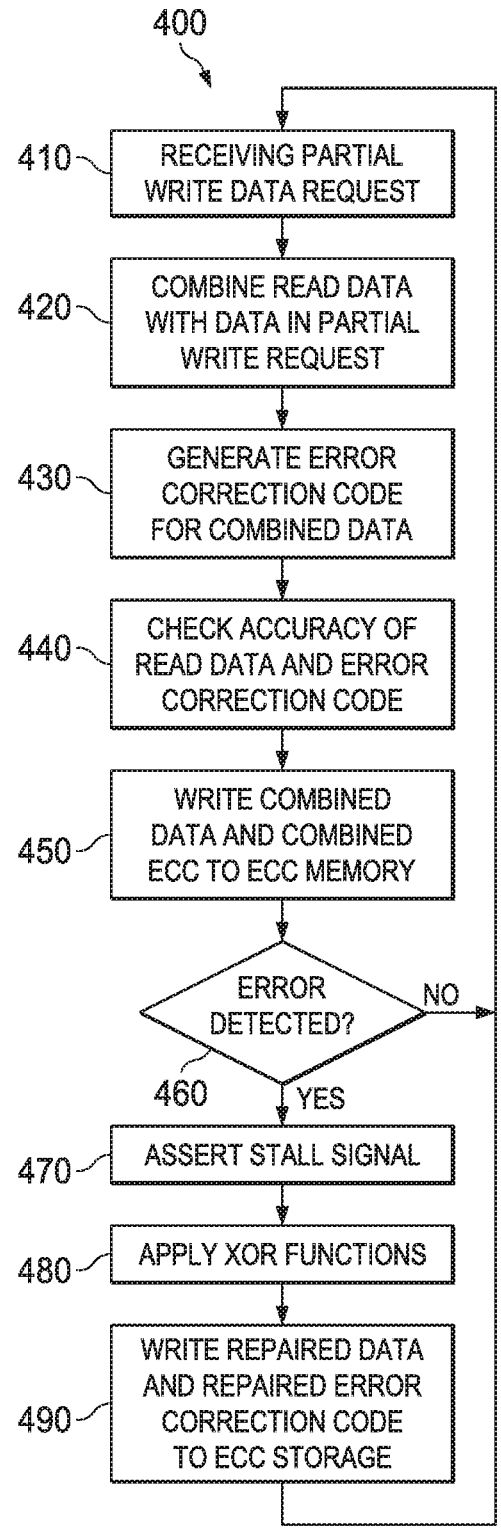
FIG. 7 is a flow diagram of another example method for executing a partial memory write.

In view of the foregoing structural and functional features described above, an example method will be better appreciated with reference to FIGS. 6 and 7. While, for purposes of simplicity of explanation, the example method of FIGS. 6 and 7 is shown and described as executing serially, it is to be understood and appreciated, unless otherwise noted, that the present examples are not limited by the illustrated order, as some actions could in other examples occur in different orders, multiple times and/or concurrently from that shown and described herein. Moreover, it is not necessary that all described actions be performed to implement a method.

FIG. 6 illustrates a flowchart of an example method 300 for executing a partial write to ECC memory. The method 300 could be executed, for example, by a memory controller, such as the memory controller 50 of FIG. 1 and/or the memory controller 100 of FIG. 2. At 310, a read-modify-write logic (e.g., the read-modify-write logic 58) receives a partial write data request for data stored in data memory (e.g., the data memory 54) of the ECC memory (e.g., the ECC memory 52). At 320, data read from the data memory is combined with data in the partial write data request at the memory read-modify-write logic to form combined data. At 330, data repair pattern and ECC repair pattern signals are generated by an ECC check and repair (e.g., the ECC check and repair 60) based on a checking of the accuracy of the read data and a corresponding error-correcting code. The read-modify-write logic executes the combining in parallel with the checking executed by the ECC check and repair.

At 340, an error-correcting code for the combined data is generated by an ECC generator (e.g., the ECC generator 64). At 350, an XOR function is executed on the data repair pattern signal and the combined data and an XOR function is executed on the ECC repair pattern signal and the error code for the combined data by a write control to generate repaired data and repaired error-correcting code. At 360, the repaired data and the repaired error-correcting code are written to the ECC memory.

FIG. 7 illustrates a flowchart of another example method 400 for executing a partial write to ECC memory. The method 400 could be executed, for example, by a memory controller, such as the memory controller 50 of FIG. 1 and/or the memory controller 200 of FIG. 4. At 410, a read-modify-write logic (e.g., the read-modify-write logic 58) receives a partial write data request for data stored in data memory (e.g., the data memory 54) of the ECC memory (e.g., the ECC memory 52). At 420, data read from the data memory is combined with data in the partial write data request at the memory read-modify-write logic to form combined data. At 430, an error-correcting code for the combined data is generated by an ECC generator (e.g., the ECC generator 64). At 430, an ECC check and repair (e.g., the ECC check and repair 60) checks the accuracy of the read data and an error-correcting code.

At 440, data and ECC repair pattern signals are generated by the ECC check and repair based on a checking of the accuracy of the read data and a corresponding error-correcting code. At 450, write control can write the combined data and the repaired error-correcting code to the ECC memory. At 460, a determination can be made by the ECC check and repair as to whether an error is detected. If the determination at 460 is negative (e.g., NO), the method 400 can returns to 410 (to process a next partial data write request). If the determination at 460 is positive (e.g., YES), the method 400 can proceed to 470. Additionally, at 460, an ECC single bit error signal can be output indicating the determination at 450.

At 470, the read-modify-write logic can assert a stall signal for one clock cycle, thereby preventing receipt and execution of subsequent partial write data requests. At 480, the write control can apply XOR functions to generate repaired data and ECC repaired data. At 490, the write control writes the repaired data and the ECC repaired data to the ECC memory. The method 400 returns to 410 to process the next partial write data request.

In this description, the term "based on" means based at least in part on. Modifications are possible in the described embodiments, and other embodiments are possible, within the scope of the claims.

What is claimed is:

1. A memory controller comprising:
a read-modify-write logic module that receives a partial write data request for partial write data in error-correcting code (ECC) memory and combines the partial write data in the partial write data request with read data provided from the ECC memory to form combined data prior to correcting the read data; and
a write control module that controls the writing of the combined data to the ECC memory.

2. The memory controller of claim 1, further comprising:
an ECC check and repair module that generates a data repair pattern signal in response to the read data and an error-correcting code;
wherein the ECC memory provides the read data and the error-correcting code to the ECC check and repair module and the read-modify-write logic module.

3. The memory controller of claim 2, wherein the write control module further comprises:
XOR data logic that executes an XOR (exclusive OR) function on the data repair pattern signal and the combined data to form repaired data that is written to the ECC memory.

4. The memory controller of claim 3, wherein the XOR function flips a proper subset of bits in the combined data to form the repaired data.

5. The memory controller of claim 2, wherein the ECC check and repair module receives the read data and the error-correcting code from the ECC memory, and the ECC check and repair module generates an ECC repair pattern signal in response to receipt of the read data and the error-correcting code that is provided to the write control module.

6. The memory controller of claim 5, further comprising:
an ECC generator that generates a new error-correcting code in response to receipt of the combined data.

7. The memory controller of claim 6, wherein the write control module further comprises:
XOR ECC logic that executes an XOR (exclusive OR) function on the ECC repair pattern signal and the new error-correcting code from the ECC generator to form a repaired error-correcting code that is written to code memory of the ECC memory.

8. The memory controller of claim 2, wherein the ECC check and repair module further comprises:
an ECC generator that generates a regenerated error-correcting code in response to receipt of the read data; and an ECC compare module that compares the regenerated error-correcting code with an error-correcting code provided from the ECC memory and generates an ECC error signal based on the comparison, wherein the ECC error signal is provided to the read-modify-write logic module and the write control module.

9. The memory controller of claim 8, wherein the memory controller registers the read data, and the read-modify-logic module asserts a stall signal for an additional clock cycle that prevents acceptance of a new memory read or write request in response to the ECC error signal indicating that at least one of bit location of the read data has an error.

10. The memory controller of claim 8, wherein the write control module further comprises:
   XOR data logic that executes an XOR (exclusive OR) function on the data repair pattern signal and the read data to form a repaired data signal; and
   a data multiplexer that receives the combined data and the repaired data at respective input nodes and the ECC error signal at a selection node.

11. The memory controller of claim 10, wherein the data multiplexer writes the combined data to the ECC memory in response to the ECC error signal indicating that no error is present in the read data and the data multiplexer writes the repaired data to the ECC memory in response to the ECC error signal indicating that at least one bit location of the read data has an error.

12. The memory controller of claim 8, wherein the ECC check and repair module generates a ECC repair pattern signal based on the error-correcting code and the read data, the ECC repair pattern being provided to the write control module and the memory controller further comprises:
   another ECC generator that generates a new error-correcting code for the combined data;
   wherein the write control module further comprises:
      XOR ECC logic that executes an XOR (exclusive OR) function on the ECC repair pattern signal and the new error-correcting code to form a repaired error-correcting code; and
      an ECC multiplexer that receives the new error-correcting code and the repaired error-correcting code at respective input nodes and the ECC error signal at a selection node.

13. The memory controller of claim 12, wherein the ECC multiplexer writes the new error-correcting code to the ECC memory in response to the ECC error signal indicating that no error is detected in the read data and the data multiplexer writes the repaired error-correcting code to the code memory of the ECC memory in response to the ECC error signal indicating that at least one of the read data and the error-correcting code has a detected error.

14. A memory controller comprising:
   an error-correcting code (ECC) check and repair module that receives read data and an error-correcting code from ECC memory and provides an ECC error signal indicating whether an error is detected in at least one bit location of the read data;
   a read-modify-write logic module that receives a partial write data request for partial write data in the ECC memory and combines the partial write data in the partial write data request with the read data provided from the ECC memory to form combined data prior to the ECC check and repair module detecting an error in the at least one bit location of the read data; and
   a write control module that controls writing of the combined data to the ECC memory based on the ECC error signal.

15. The memory controller of claim 14, wherein the memory controller registers the read data and the read-modify-write logic module asserts a stall signal for an extra clock cycle in response to the ECC error signal indicating that an error is detected in at least one bit location of the read data, wherein assertion of the stall signal prevents receipt of subsequent read requests or write requests.

16. The memory controller of claim 14, wherein the ECC check and repair module further comprises:
   an ECC generator that generates a regenerated error-correcting code in response to receipt of the read data; and
   an ECC compare module that compares the error-correcting code with the regenerated error-correcting code to generate the ECC error signal and a syndrome signal that identifies a set of bits in the read data and/or the error-correcting code that have an error.

17. The memory controller of claim 16, wherein the ECC check and repair module further comprises:
   a data repair look-up table (LUT) that generates a data repair pattern signal that is provided to the write control in response to the syndrome signal; and
   an ECC repair LUT that generates a ECC repair pattern signal that is provided to the write control module in response to the syndrome signal.

18. A method comprising:
   receiving a partial write data request for data in error-correcting code (ECC) memory;
   combining partial write data in the partial write data request with read data provided from a data memory of the ECC memory to form combined data; and
   checking the accuracy of the read data in parallel with the combining.

19. The method of claim 18, further comprising:
   generating a data repair pattern signal based on the checking; and
   generating a ECC repair pattern signal based on the checking.

20. The method of claim 19, further comprising:
   generating a new error-correcting code based on the combined data;
   executing an XOR (exclusive OR) function on the combined data and the data repair pattern signal; and
   executing another XOR function on the new error-correcting code and the ECC repair pattern signal.

* * * * *